United States Patent [19]

Nagasawa et al.

[11] Patent Number: 5,379,075
[45] Date of Patent: Jan. 3, 1995

[54] VIDEO SIGNAL AGC CIRCUIT FOR ADJUSTING THE SYNC LEVEL OF A VIDEO SIGNAL

[75] Inventors: Hirokazu Nagasawa, Kanagawa; Masahiro Yamaguchi, Tokyo; Hiroaki Matsumoto, Chiba, all of Japan

[73] Assignee: Sony Corporation, Tokyo, Japan

[21] Appl. No.: 12,400

[22] Filed: Feb. 2, 1993

[30] Foreign Application Priority Data

Feb. 4, 1992 [JP] Japan .................................. 4-047614
Feb. 4, 1992 [JP] Japan .................................. 4-047615

[51] Int. Cl.[6] ............................................. H04N 5/52
[52] U.S. Cl. ................................. 348/678; 348/691; 348/572
[58] Field of Search ............... 358/171, 172, 174, 176, 358/178; H04N 5/52, 5/53, 5/54, 5/56, 5/20, 5/16, 5/18; 348/691, 695, 696, 697, 572, 678, 680, 682, 685

[56] References Cited

U.S. PATENT DOCUMENTS 4,680,633 7/1987 Gerdes et al. .
4,970,594 11/1990 Kitaura et al. .
4,989,074 1/1991 Matsumoto .......................... 358/174

FOREIGN PATENT DOCUMENTS 2511568 2/1983 France .
0128676 5/1989 Japan .................................. 358/171

OTHER PUBLICATIONS

Patent Abstracts of Japan, vol. 16, No. 517 (E–1284) 23 Oct. 1992 & JP-A-41 92 677 (Matsushita Electric Ind. Co., Ltd.) 10 Jul. 1992.
Patent Abstracts of Japan vol. 12, No. 118 (E–600) 13 Apr. 1988 & JP-A-62 245 780 (Mitsubishi Electric Corp.) 27 Oct. 1987.
Patent Abstracts of Japan vol. 11, No. 11 (E–470) 13 Jan. 1987 & JP-A-61 186 090 (Hitachi Denshi Ltd.) 19 Aug. 1986.
Patent Abstracts of Japan, vol. 8, No. 53 (E–231) 27 May 1982 & JP-A-58 206 214 (Nippon Denki K.K.) 1 Dec. 1983.

*Primary Examiner*—David E. Harvey
*Attorney, Agent, or Firm*—William S. Frommer; Alvin Sinderbrand

[57] ABSTRACT

A video signal AGC circuit including an analog gain control amplifier for adjusting the level of an input analog video signal; an A-D converter for converting the output of the analog gain control amplifier to a digital video signal; a sync level detector for detecting the sync level of the digital video signal outputted from the A-D converter; a digital gain control amplifier for adjusting the level of the digital video signal outputted from the A-D converter; a first control signal generator for generating a first control signal to adjust the gain of the analog gain control amplifier on the basis of the output of the sync level detector; and a second control signal generator for generating a second control signal to adjust the gain of the digital gain control amplifier on the basis of the output of the sync level detector. In this AGC circuit, the sync level detector includes a detector for detecting the sync signal of the output of the A-D converter; a detector for detecting, on the basis of the sync signal, the pedestal data corresponding to the pedestal level; and a detector for detecting, on the basis of the sync signal, the sync tip data corresponding to the sync tip level.

19 Claims, 7 Drawing Sheets

5,379,075

VIDEO SIGNAL AGC CIRCUIT FOR ADJUSTING THE SYNC LEVEL OF A VIDEO SIGNAL

BACKGROUND OF THE INVENTION

1. Field of the Invention

The present invention relates to a level control circuit for executing automatic gain control (AGC) and clamp of a video signal in a magnetic recording/playback apparatus or the like and, more particularly, to a sync AGC circuit for adjusting the sync level of a video signal to a predetermined level.

2. Description of the Prior Art

The video signal AGC circuits known heretofore are classified into an analog type and a digital type.

FIG. 5 is a block diagram of a conventional analog video AGC circuit; FIG. 6 is a block diagram of a conventional digital video AGC circuit; and FIG. 7 is a waveform chart of a video signal inputted to a video AGC circuit.

In FIGS. 5 and 7, an analog gain control amplifier 21 is controlled by the output of a control voltage generator 24 to adjust the gain so that a sync level L, which is the difference between a sync tip level a of the output video signal and a pedestal level b thereof, is maintained at a predetermined level (e.g., 0.5 V). A sync level detector 22 detects the sync level. L of the video signal outputted from the analog gain control amplifier 21. This detector 22 consists of a circuit for sampling and holding the sync tip level a of the video signal and the pedestal level b thereof and outputting the difference. A reference level adjuster 23 generates a reference voltage for setting the sync level L of the output video signal to a predetermined level (e.g., 0.5 V), and a control voltage generator 24 generates a difference voltage between the sync level L of the output video signal obtained from the sync level detector 22 and the reference voltage outputted from the reference level adjuster 23, and then delivers the gain control voltage to the analog gain control amplifier 21.

In the analog video AGC circuit of the configuration mentioned above, feedback control is so performed that the sync level L of the output video signal obtained from the sync level detector 22 is equalized to the output of the reference level adjuster 23, whereby the sync level L of the output video signal is maintained under control at a predetermined level (e.g., 0.5 V).

Next in FIG. 6, an analog gain control amplifier 31 is controlled by the output of a control voltage generator 36 and adjusts the gain for equalizing the sync level L of the output video signal to a predetermined level (e.g., 0.5 V). An A-D converter 32 converts the output of the analog gain control amplifier 31 to, e.g., a 10-bit parallel digital video signal. A sync signal detector 33 detects a sync signal included in the digital video signal, and a pedestal detector 34 detects pedestal data, which corresponds to the pedestal level b of the digital video signal, on the basis of the output of the sync signal detector 33. A sync tip detector 35 detects sync tip data, which corresponds to the sync tip level a of the digital video signal, on the basis of the output of the sync Signal detector 33. Further a control voltage generator 36 generates a gain control voltage on the basis of the pedestal data obtained from the pedestal level detector 34 and also on the basis of the sync tip data obtained from the sync tip detector 35, so as to equalize the sync level L of the output digital video signal, which is the difference between the pedestal data and the sync tip data, to a predetermined level (e.g., 0.5 V). And such gain control voltage is supplied to the analog gain control amplifier 31.

In the digital video AGC circuit of the configuration mentioned above, the sync level of the output digital video signal is controlled to a predetermined level (e.g., 0.5 V) as in the foregoing case of FIG. 5. And the operation of clamping the video signal is performed usually in the preceding stage of the analog gain control amplifier 21.

However, in such conventional analog video AGC circuit, there exists a problem that a nonadjustment constitution is not realizable due to the necessity of a reference level adjuster. Furthermore, a high-resolution gain control amplifier is required to execute the gain control with a high precision to consequently render the circuit operation unstable.

Since the conventional video AGC circuit mentioned above has a feedback control configuration, oscillation is caused if the response speed is raised, and the transient response is unsatisfactory at the occurrence of any sharp variation in the input video signal level or at the rise from a no-signal stage. And there are some more problems including that the gain of the analog gain control amplifier is controlled to its maximum at the rise from a no-signal state, and proper detection of the sync signal fails to be performed. And upon simultaneous occurrence of such undesired conditions, a release from the above state is rendered impossible or needs an extremely long time.

Furthermore, due to the constitution of hardware alone, it is impossible to achieve a variety of settings for individual cases. Therefore, the compliance is limited merely to one for various input conditions of video signals where, for example, the ratios of the sync levels to the peak-to-peak values of the video signals are mutually different.

OBJECTS AND SUMMARY OF THE INVENTION

It is an object of the present invention to provide, by solution of the problems mentioned, an improved video level control circuit having excellent transient response characteristics.

Another object of the present invention resides in providing an improved video level control circuit which ensures superior transient response characteristics and is capable of executing complicated processes inclusive of setting different characteristics in conformity with various input conditions of video signals while achieving a high degree of freedom with regard to the circuit configuration.

According to a first aspect of the present invention, there is provided a video AGC circuit which comprises an analog gain control amplifier for controlling the level of an input analog video signal, an A-D converter for converting the output of the analog gain control amplifier to a digital video signal, a sync level detector for detecting the sync level of the digital video signal outputted from the A-D converter, a digital gain control amplifier for controlling the level of the digital video signal outputted from the A-D converter, a first control signal generator for generating a first control signal to adjust the gain of the analog gain control amplifier on the basis of the output of the sync level detector, and a second control signal generator for generating a second control signal to adjust the gain of the digital gain control amplifier on the basis of the output of the sync level detector.

In the video AGC circuit of such constitution, the input analog video signal is controlled by the first control signal in the analog gain control amplifier and, after being adjusted to a predetermined level, it is converted to a digital video signal in the A-D converter. Subsequently the digital video signal thus obtained is controlled by the second control signal in the digital gain control amplifier and then is adjusted again to the predetermined level.

According to a second aspect of the present invention, there is provided a video level control circuit which comprises an A-D converter for converting an input analog video signal to a digital video signal, a sync tip detector for detecting the sync tip level of the digital video signal, a clamp data generator for generating clamp data on the basis of the output of the sync tip detector, and a digital clamper for clamping the sync tip of the digital video signal to a predetermined level on the basis of the output of the clamp data generator.

According to a third aspect of the present invention, there is provided a video level control circuit which comprises an A-D converter for converting an input analog video signal to a digital video signal, a sync tip detector for detecting the sync tip level of the digital video signal, a pedestal detector for detecting the pedestal level of the digital video signal, a gain control data generator for generating gain control data on the basis of the output of the sync tip detector and that of the pedestal detector, and a digital gain control amplifier for controlling the sync level of the digital Video signal to a predetermined level on the basis of the output of the gain control data generator.

According to a fourth aspect of the present invention, there is provided a video level control circuit which comprises an A-D converter for converting an input analog video signal to a digital video signal, a sync tip detector for detecting the sync tip level of the digital video signal, a pedestal detector for detecting the pedestal level of the digital video signal, a level control data generator for generating clamp data and gain control data on the basis of the output of the sync tip generator and that of the pedestal generator, a digital clamper for clamping the sync tip of the digital video signal to a predetermined level on the basis of the clamp data obtained from the level control data generator, and a digital gain control amplifier for adjusting the sync level of the output digital video signal of the digital clamper to a predetermined level on the basis of the gain control data obtained from the level control data generator.

In this video level control circuit of the constitution mentioned, the input analog video signal is converted to a digital video signal by the A-D converters. And the clamp data generated in the clamp data generator on the basis of the sync tip level of the digital video signal obtained from the sync tip detector is subtracted from the digital video signal by the digital clamper. Therefore the digital video signal outputted from the digital clamper has a proper sync tip clamped to the predetermined value.

Also in the above control circuit of the present invention, the input analog video signal is converted to a digital video signal by the A-D converter. And gain control data is generated in the gain control data generator on the basis of both the sync tip level of the digital video signal obtained from the sync tip detector and the pedestal level of the digital video signal obtained from the pedestal detector, and then is outputted to the digital gain control amplifier. Therefore the digital video signal outputted from the digital gain control amplifier has a proper sync level controlled to the predetermined value.

Further in the control circuit of the present invention, the input analog video signal is converted to a digital video signal by the A-D converter. Clamp data and gain control data are generated in the level control data generator on the basis of both the sync tip level of the digital video signal obtained from the sync tip detector and the pedestal level of the digital video signal obtained from the pedestal detector, and then are outputted respectively to the digital clamper and the digital gain control amplifier. Therefore the sync tip level of the digital video signal is clamped to a predetermined level by the digital clamper, and subsequently the sync level is controlled to a predetermined level by the digital gain control amplifier. Consequently the digital video signal outputted from the digital gain control amplifier has a proper sync tip level clamped to the predetermined value and a proper sync level controlled to the predetermined value.

The above and other features and advantages of the present invention will become apparent from the following description which will be given with reference to the illustrative accompanying drawings.

DESCRIPTION OF THE PREFERRED EMBODIMENTS

Hereinafter preferred embodiments of the present invention will be described in detail with reference to the accompanying drawings.

Figure 1:
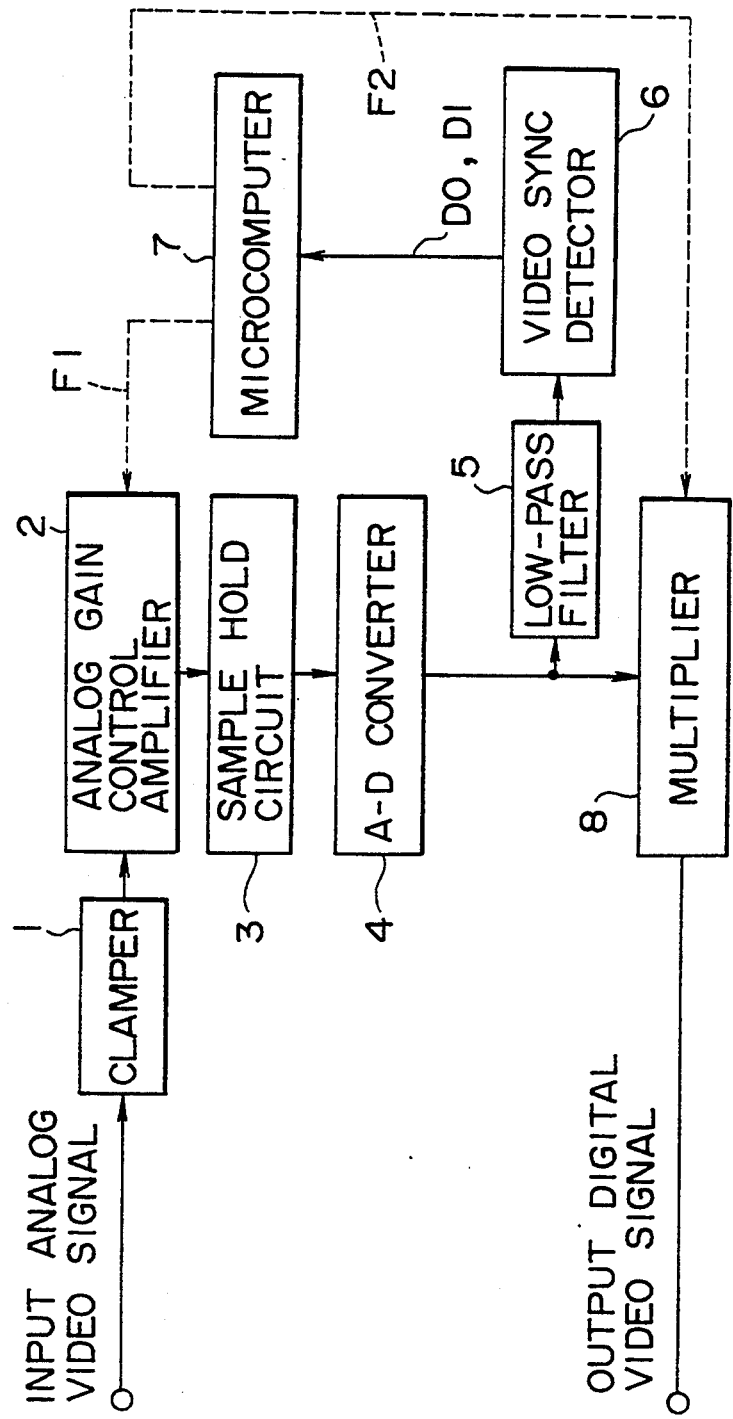
FIG. 1 is a block diagram of a first embodiment representing the video AGC circuit of the present invention.
Figure 7:
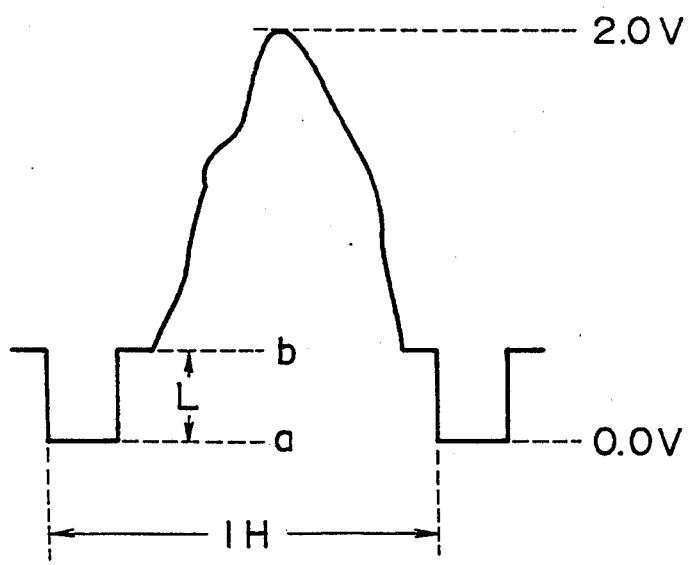
FIG. 7 is a waveform chart of a video signal inputted to a video AGC circuit.

FIG. 1 is a block diagram of a first embodiment representing the video AGC circuit of the invention, wherein a clamper 1 clamps the sync tip of an input analog video signal to a predetermined level. In case the analog video signal has an amplitude of 2.0 Vp-p as shown in FIG. 7, its sync tip is clamped to a level of 0.0 V. An analog gain control amplifier 2 is controlled by an analog output signal F1 from a microcomputer 7 to adjust the output level of the clamper 1, thereby executing gain control to adjust the sync level L of the output video signal to a predetermined level (e.g., 0.5 V). A sample hold circuit 3 samples and holds the output video signal of the analog gain control amplifier 2 at a 4-fold frequency of the color subcarrier. An A-D converter 4 converts the output of the sample hold circuit 3 to a 10-bit digital video signal. A low-pass filter 5 serves to cut off the noise component and the color component included in the digital video signal, and a video sync detector 6 detects the sync tip level and the pedestal level of the digital video signal outputted from the low-pass filter 5. This video sync detector 6 corresponds to the sync signal detector 33, the pedestal detector 34 and the sync tip detector 35 used in the aforementioned conventional digital video AGC circuit. The microcomputer 7 generates, on the basis of the sync tip level and the pedestal level obtained from the video sync detector 6, an analog output signal for adjusting the gain of the analog gain control amplifier 2 and also digital data (coefficient value) F2 to be supplied to a multiplier 8. This multiplier 8 multiplies the output digital video signal of the A-D converter 4 by the digital data obtained from the microcomputer 7, thereby adjusting the sync level of the digital video signal to a predetermined value (e.g., 0.5 V). This multiplier 8 functions as a digital gain control amplifier.

Figure 2:
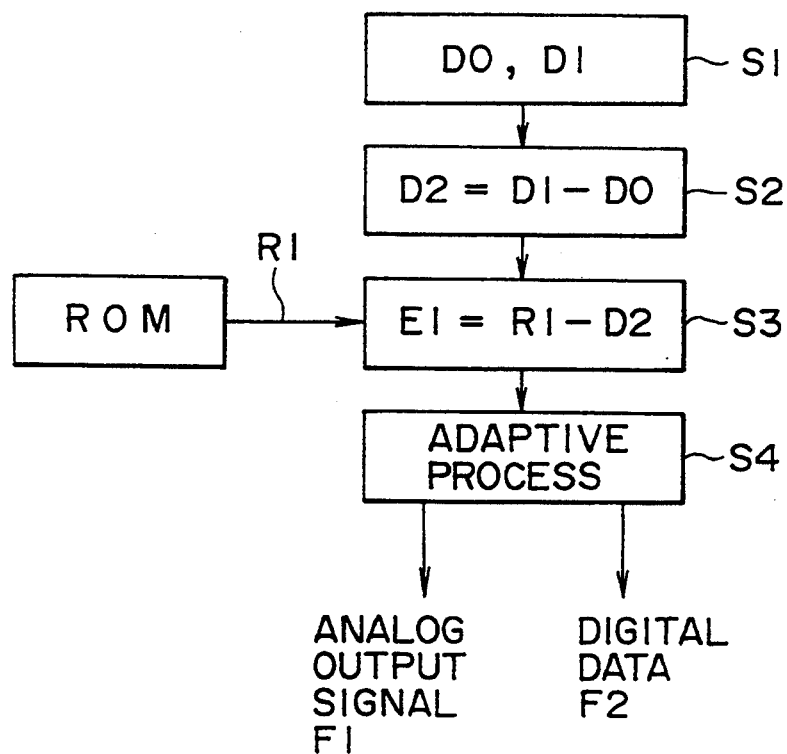
FIG. 2 is a flow chart showing the operation of a microcomputer employed in the first embodiment of FIG. 1.

FIG. 2 is a flow chart showing the operation of the microcomputer in the first embodiment of the present invention.

First at step S1, the sync tip level data D0 and the pedestal level data D1 obtained from the video sync detector 6 are inputted to the microcomputer. Then the difference between the data D1 and D0 is calculated at step S2, so that data D2 corresponding to the sync level L is obtained. Subsequently at step S3, error data E1 is obtained by calculating the difference between the data D2 and the reference sync level R1 (e.g., equivalent to 0.5 V) stored in a ROM. Thereafter an adaptive process is executed at step S4 to produce an analog output signal F1 as a function of the error data E for controlling the analog gain control amplifier 2 and also digital data F2 to be outputted to the multiplier 8.

Each of the sync tip level and the pedestal level detected by the video sync detector 6 is composed of 10 bits and is transferred in the form of a serial signal or a parallel signal to the microcomputer 7.

The adaptive process executed at step 4 includes the following procedure.

(1) For example, 8-bit error data E1 is converted to 4-bit error data and then is processed through digital-to-analog conversion to produce an analog output signal F1, whereby coarse adjustment of the sync level is performed in the analog gain control amplifier 2.

(2) Digital data F2 is produced by fully utilizing the 8-bit error data E1, whereby fine adjustment of the sync level is performed in the multiplier 8.

(3) The time constants of the analog amplifier and the digital amplifier are changed by supplying the analog output F1 to the analog gain control amplifier 2 at a rate of once within a time range of one field to several seconds and supplying the digital data F2 to the multiplier 8 at a rate of once within a time range of one horizontal scanning interval to one field. Then the gentle variations are absorbed by the analog gain control amplifier, and any sharp variations left unabsorbed therein are absorbed by the digital gain control amplifier.

(4) If any steep variation occurs in the error data E1 merely during a short period of time, the error data prior thereto is used instead to consequently avert harmful influence of the noise.

In the video AGC circuit of the constitution mentioned, the sync tip of the input analog video signal is clamped to a predetermined level (e.g., 0.0 V) by the clamper 1, and the sync level L thereof is adjusted through gain control to a predetermined level (e.g., 0.5 V) in accordance with the analog output signal F1 obtained from the microcomputer 7.

The output of the analog gain control amplifier 2 is sampled and held by the sample hold circuit 3 and then is converted to a 10-bit parallel digital video signal by the A-D converter. Subsequently any unrequired component such as noise is cut off through the low-pass filter 5. And both the sync tip data D0 and the pedestal data D1 obtained from the video sync detector 5 are transferred to the microcomputer 7.

The analog output signal F1 produced by the microcomputer 7 on the basis of the sync tip data D0 and the pedestal data D1 is supplied to the analog gain control amplifier 2 where the gain is adjusted. As a result, the analog video signal outputted from the analog gain control amplifier 2 has a proper sync level L adjusted to the predetermined value (e.g., 0.5 V).

Similarly, the gain control data F2 produced by the microcomputer 7 on the basis of the sync tip data D0 and the pedestal data D1 is supplied to the multiplier 8, where the digital video signal is multiplied by the gain control data F2. As a result, the digital video signal outputted from the multiplier 8 has a proper sync level adjusted to the predetermined value (e.g., 0.5 V).

If a circuit for detecting the peak-to-peak value of the video signal is additionally provided in the first embodiment described above, it becomes possible to constitute a peak AGC circuit for adjusting the peak-to-peak value to a predetermined level, or to realize a combined constitution of a sync AGC circuit and a peak AGC circuit.

According to the present invention, as described above in detail, the following advantageous effects are achievable.

(1) No additional adjustment is necessary since the gain control is executed with reference to the digital data in the analog gain control amplifier and the digital gain control amplifier.

(2) After the gain control of the video signal in the analog gain control amplifier, the gain is further adjusted to an exact value in the digital gain control amplifier inclusive of the multiplier, so that the resolution (sensitivity) of the analog gain control amplifier need not be so high to consequently stabilize the circuit operation.

(3) A higher performance of the video AGC amplifier is attainable, in comparison with the conventional one, by setting the time constant of the analog gain control amplifier and that of the digital gain control amplifier to adequate values. For example, the transient response characteristics can be improved by applying feedback control with a great time constant to the analog gain control amplifier while applying feedforward control with a small time constant to the digital gain control amplifier.

Figure 3:
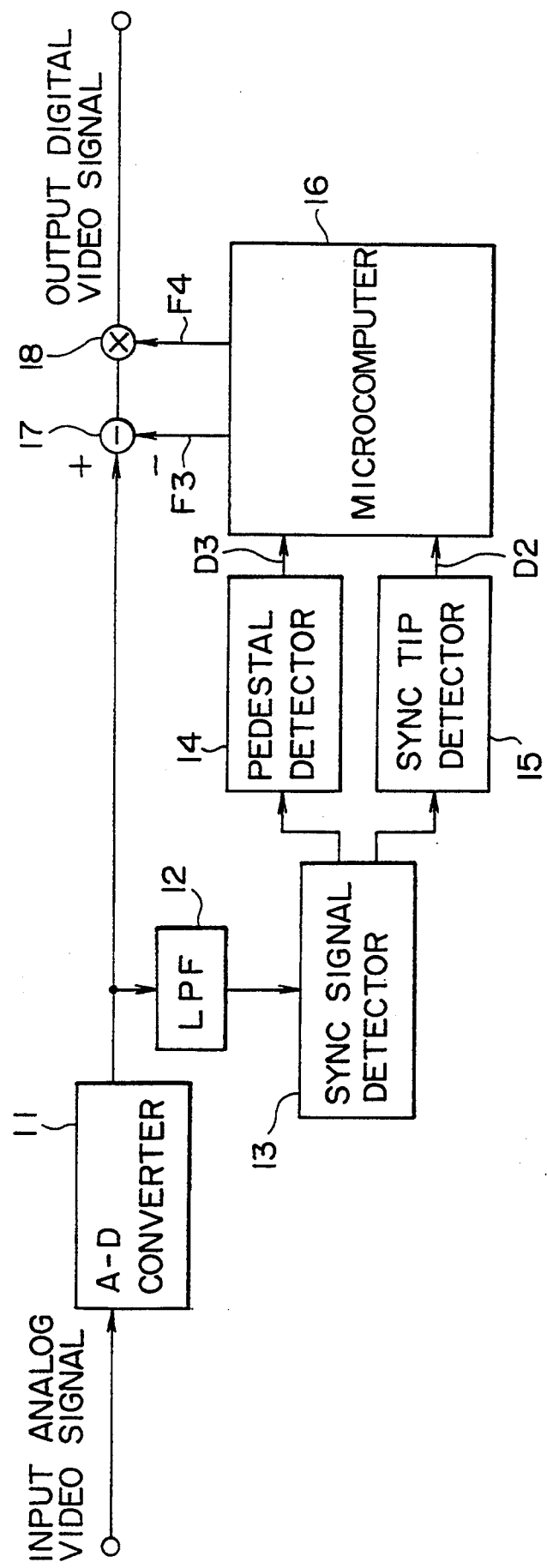
FIG. 3 is a block diagram of a second embodiment representing the video level control circuit of the present invention.

Hereinafter a second embodiment of the present invention will be described in detail with reference to FIGS. 3 and 4. FIG. 3 is a block diagram of the second embodiment representing the video level control circuit of the invention.

An A-D converter 11 converts an input analog video signal to a 10-bit parallel digital video signal, and a low-pass filter 12 cuts off the noise component and the color component included in the digital video signal. A sync signal detector 13 detects the sync signal of the digital video signal outputted from the low-pass filter 12; and a pedestal detector 14 detects pedestal data D3, which corresponds to the pedestal level b of the digital video signal, on the basis of the output of the sync signal detector 13. A sync tip detector 15 detects sync tip data D2, which corresponds to the sync tip level a of the digital video signal, on the basis of the output of the sync signal detector 13; and a microcomputer 16 executes a predetermined processing routine (which will be described later in detail) in accordance with the output data of both the pedestal detector 14 and the sync tip detector 15 transferred thereto. A subtracter 17 serving as a digital clamper subtracts the clamp data F3, which is produced by the microcomputer 16, from the digital video signal outputted from the A-D converter 11. And a multiplier 18 serving as a digital gain control amplifier multiplies the gain control data F4, which is obtained from the microcomputer 16, by the output of the subtracter 17.

The input and output data transferred to and from the microcomputer 16 may be in either a serial or parallel signal form.

Figure 4:
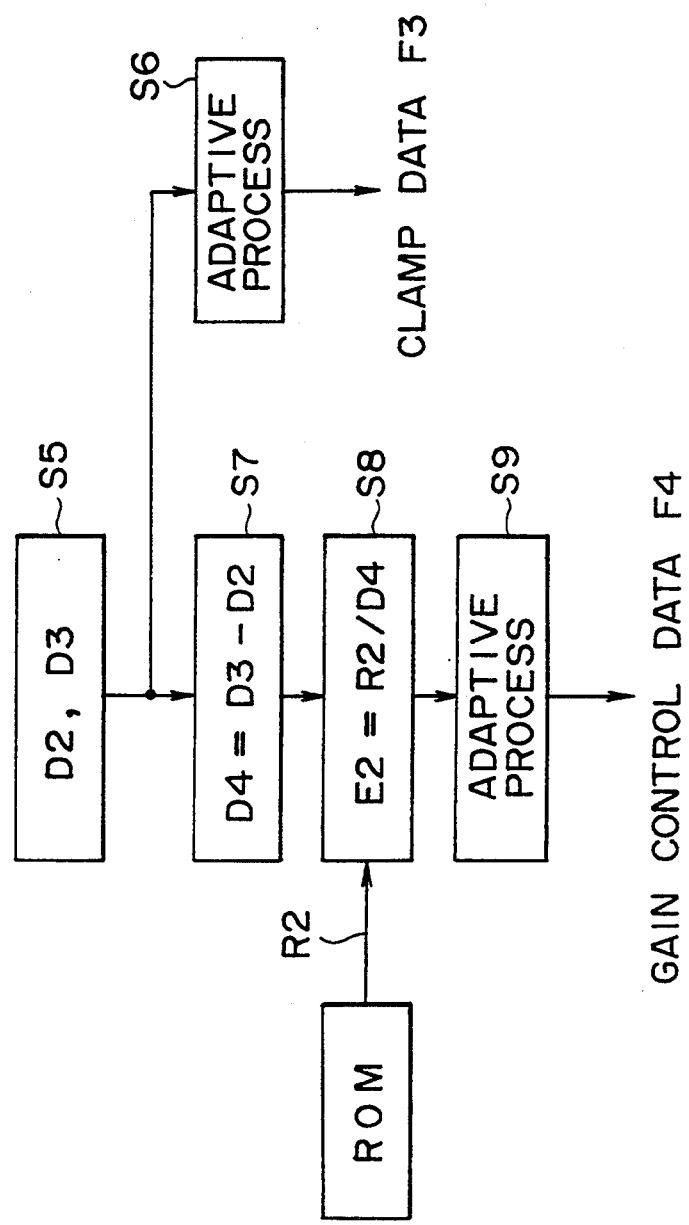
FIG. 4 is a flow chart showing the operation of a microcomputer employed in the second embodiment of FIG. 3.
Figure 5:
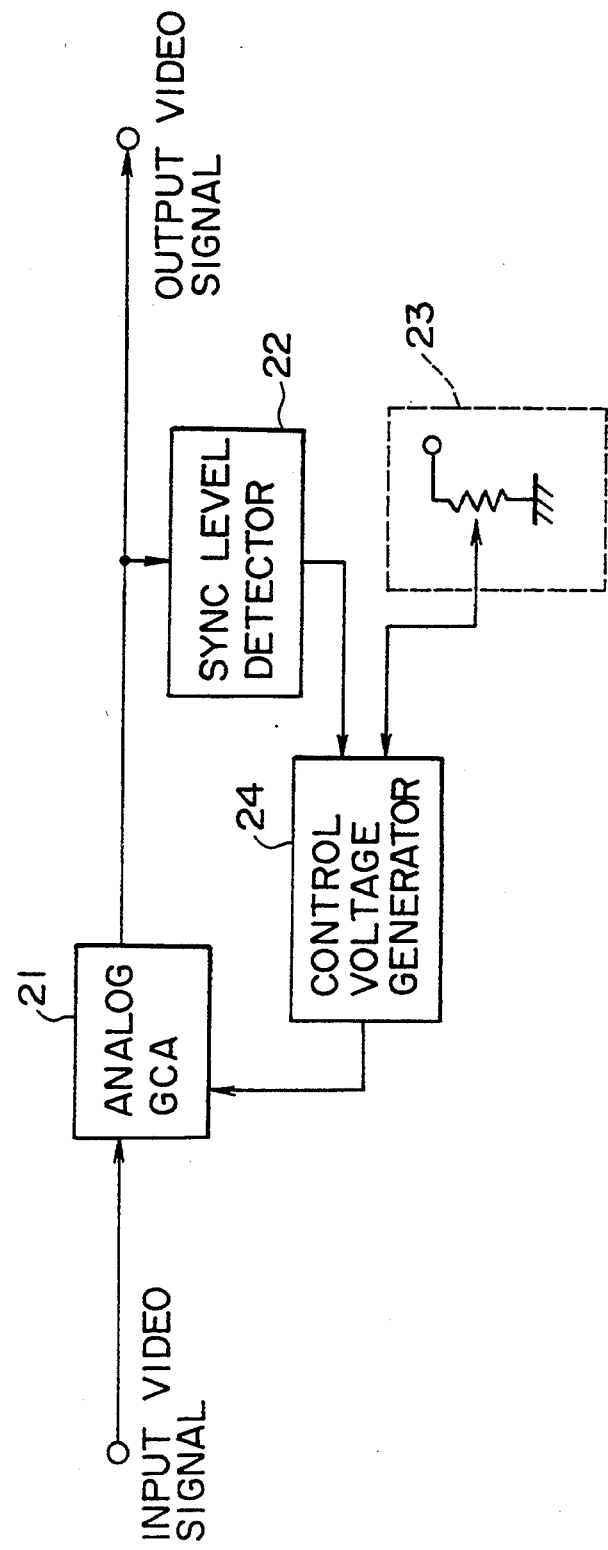
FIG. 5 is a block diagram of a conventional analog video AGC circuit.
Figure 6:
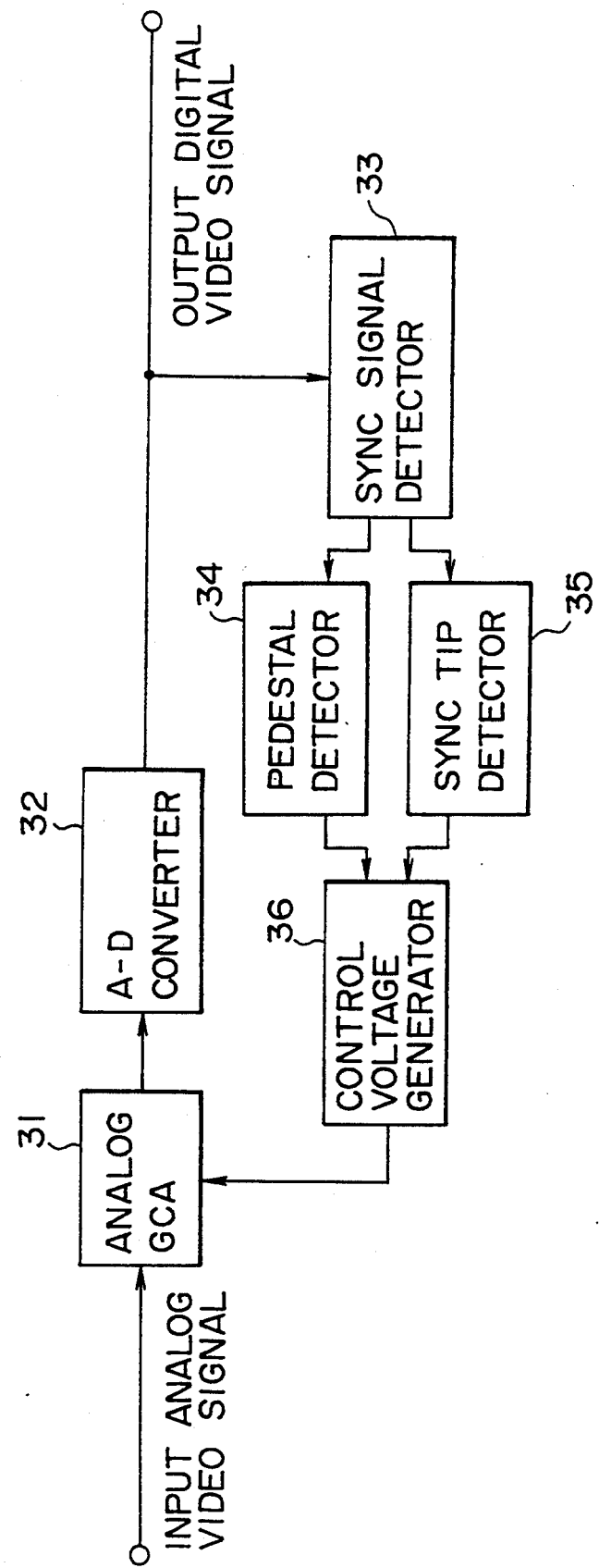
FIG. 6 is a block diagram of a conventional digital video AGC circuit.

FIG. 4 is a flow chart showing the operation of the microcomputer in the second embodiment of the present invention.

First at step S5, the sync tip data D2 obtained from the sync tip detector 15 is inputted to the microcomputer 16, and then the pedestal data D3 from the pedestal detector 14 is inputted thereto.

The next process is branched into a step for obtaining the clamp data F3 and a step for obtaining the gain control data F4.

The clamp data F3 is a function of the sync tip data D2 and is produced by an adaptive process executed at step S6. The adaptive process includes the following procedure for example.

(1) The difference between the detected sync tip data D2 and a predetermined clamp level (e.g., 0.0 V) is calculated. And when the difference is approximate to 0, gently-changing clamp data is outputted to the subtracter 17; whereas, when the difference is widely different from 0, quickly-changing clamp data is outputted thereto.

(2) In case any sharp variation has occurred in the sync tip data D2 merely during a short period of time, the clamp data prior thereto is used instead.

(3) The clamp data F3 is outputted periodically to the subtracter 17 at a preset rate (e.g., once within a time of several horizontal scanning intervals).

Meanwhile at step S7, the difference between the data D2 and D3 is calculated to obtain data D4 corresponding to the sync level L. Subsequently at step S8, there is calculated the ratio of the data D4 to the reference sync level R2 (e.g., equivalent to 0.5 V) stored in a ROM, whereby error data E2 is obtained. And at step S9, an adaptive process is executed to produce gain control data F4 which is a function of the error data E2.

The adaptive process executed at step S9 includes the following procedure for example.

(1) When the error data E2 is a value approximate to 1, gently-changing gain control data is outputted to the multiplier 18; whereas, when the error data E2 is a value widely different from 1, quickly-changing gain control data is outputted thereto.

(2) In case any sharp variation has occurred in the error data E2 merely during a short period of time, the preceding gain control data prior thereto is used instead.

(3) The gain control data F4 is outputted periodically to the multiplier 18 at a preset rate (e.g., once within a time of several horizontal scanning intervals).

In the level control circuit of the constitution mentioned above, the input analog video signal is converted to a 10-bit parallel digital video signal by the A-D converter 11, and its unrequired components such as the noise and color components are cut off through the low-pass filter 12. Thereafter the sync tip data D2 obtained from the sync tip detector 15 and the pedestal data D3 from the pedestal detector 14 are transferred to the microcomputer 16.

The clamp data F3 produced by the microcomputer 16 on the basis of the sync tip data D2 is transferred to the subtracter 17 so as to be subtracted from the digital video signal. As a result, the digital video signal outputted from the subtracter 17 has a proper sync tip level clamped to the predetermined value (e.g., 0.0 V).

Meanwhile the gain control data F4 produced by the microcomputer 16 on the basis of the sync tip data D2 and the pedestal data D3 is transferred to the multiplier 18 so as to multiply the digital video signal. As a result, the digital video signal outputted from the multiplier 18 has a proper sync level adjusted to the predetermined value (e.g., 0.5 V).

If a circuit for detecting the peak-to-peak value of the video signal is additionally provided in the second embodiment mentioned above, it becomes possible to constitute a peak AGC circuit or to realize a combined constitution of a sync AGC circuit and a peak AGC circuit.

According to the present invention, as described above in detail, the following advantageous effects are achievable.

(1) Due to the feedforward type circuit configuration, the AGC circuit and the level clamping circuit can be formed to have a response predictive function. Therefore, excellent transient response characterristic is ensured in the level control circuit.

(2) In a system constituted in combination with a microcomputer, any of different time constants and so forth is rendered selectable as desired by presetting various input video signal conditions, hence enhancing the degree of freedom in the circuit configuration to consequently realize further complicated processes.

We claim:

1. A video signal AGC circuit, comprising
   an analog gain control amplifier for adjusting the level of an input analog video signal;
   an A-D converter for converting the output of said analog gain control amplifier to a digital video signal output;
   a sync level detector including means for detecting the sync signal of the output of said A-D converter, means for detecting, on the basis of said sync signal, the pedestal data corresponding to the pedestal level, and means for detecting, on the basis of said sync signal, the sync tip data corresponding to the sync tip level;
   a digital gain control amplifier for adjusting the level of the digital video signal outputted from said A-D converter;
   a first control signal generator for generating a first control signal to adjust the gain of said analog gain control amplifier on the basis of the output of said sync level detector; and
   a second control signal generator for generating a second control signal to adjust the gain of said digital gain control amplifier on the basis of the output of said sync level detector.

2. The video signal AGC circuit according to claim 1, further comprising:
- means for detecting the digital sync level on the basis of the difference between said pedestal data and said sync tip data; and
- a memory for storing a predetermined sync level;
- wherein said first and second control signals are generated on the basis of the difference between said detected digital sync level and the predetermined sync level.

3. The video signal AGC circuit according to claim 2, wherein said first control signal generator, said second control signal generator, said means for detecting the digital sync level and said memory consist of a microcomputer.

4. The video signal AGC circuit according to claim 3, wherein said second control signal is so formed as to attain a higher control precision than that of said first control signal.

5. The video signal AGC circuit according to claim 3, wherein, when any sharp variation has occurred in said first or second control signal merely during a short period of time, the preceding data prior thereto is used instead.

6. The video signal AGC circuit according to claim 3, wherein said digital gain control amplifier consists of a multiplier.

7. The video signal AGC circuit according to claim 3, wherein the time constant of said analog gain control amplifier and that of said digital gain control amplifier are set to be different from each other.

8. The video signal AGC circuit according to claim 7, wherein the time constant of said analog gain control amplifier is set to be greater than the time constant of said digital gain control amplifier.

9. A video signal level control circuit, comprising:
- an A-D converter for converting an input analog video signal to a digital video signal;
- a sync tip detector for detecting the sync tip level of the digital video signal;
- a clamp data generator consisting of a microcomputer which calculates the difference between the detected sync tip data and a predetermined clamp level, and produces gently-changing clamp data in conformity with any difference value approximate to 0, or produces quickly-changing clamp data in conformity with any difference value widely different from 0; and
- a digital clamper consisting of a subtractor for clamping the sync tip of the digital video signal to a predetermined level on the basis of the output of said clamp data generator.

10. A video signal level control circuit, comprising:
- an A-D converter for converting an input analog video signal to a digital video signal;
- a sync tip detector for detecting the sync tip level of the digital video signal;
- a clamp data generator consisting of a microcomputer for generating clamp data on the basis of the output of said sync tip detector, and, when any sharp variation has occurred in the detected sync tip data merely during a short period of time, said microcomputer uses the preceding clamp data prior thereto; and
- a digital clamper consisting of a subtractor for clamping the sync tip of the digital video signal to a predetermined level on the basis of the output of said clamp data generator.

11. The video signal level control circuit according to claim 10, wherein said microcomputer outputs the clamp data periodically at a predetermined time interval.

12. A video signal level control circuit comprising:
- an A-D converter for converting an input analog video signal to a digital video signal;
- a sync tip detector for detecting the sync tip level of the digital video signal;
- a pedestal detector for detecting the pedestal level of the digital video signal;
- a level control data generator for generating clamp data and gain control data on the basis of the outputs of said sync tip detector and said pedestal detector respectively;
- a digital clamper for clamping the sync tip of the digital video signal to a predetermined level on the basis of the clamp data outputted from said level control data generator; and
- a digital gain control amplifier for adjusting the sync level of the output digital video signal of said digital clamper to a predetermined level on the basis of the gain control data outputted from said level control data generator.

13. The video signal level control circuit according to claim 12, wherein said digital clamper consists of a subtracter.

14. The video signal level control circuit according to claim 13, wherein said level control data generator consists of a microcomputer.

15. The video signal level control circuit according to claim 12, further comprising:
- a sync level detector for detecting the sync level of the video signal on the basis of both the pedestal data and the sync tip data; and a
- memory for storing a predetermined sync level;
- wherein the gain control data is generated on the basis of the ratio of said detected sync level to said predetermined sync level.

16. The video signal level control circuit according to claim 15, wherein said level control data generator consists of a microcomputer.

17. The video signal level control circuit according to claim 16, wherein said microcomputer generates gently-changing gain control data when the ratio of said detected sync level to said predetermined sync level is approximate to 1, or generates quickly-changing gain control data when such ratio is widely different from 1.

18. The video signal level control circuit according to claim 16, wherein, when any sharp variation has occurred in the ratio of said detected sync level to said predetermined sync level merely during a short period of time, said microcomputer uses the preceding gain control data prior thereto.

19. The video signal level control circuit according to claim 16, wherein said microcomputer generates the gain control data periodically at a predetermined time interval.

* * * * *